US006172416B1

(12) United States Patent
Miyahara et al.

(10) Patent No.: US 6,172,416 B1
(45) Date of Patent: *Jan. 9, 2001

(54) HEAT SINK UNIT FOR COOLING A PLURALITY OF EXOTHERMIC UNITS, AND ELECTRONIC APPARATUS COMPRISING THE SAME

(75) Inventors: Masaharu Miyahara; Kenji Suga, both of Nakatsu; Hisao Tada, Fukuoka-ken; Sumio Tate, Kasuga; Kazuhiko Sugimoto, Fukuoka, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/019,054

(22) Filed: Feb. 5, 1998

(30) Foreign Application Priority Data

Feb. 10, 1997 (JP) ................................... 9-026472

(51) Int. Cl.[7] .............................. H05K 7/20; H01L 23/34
(52) U.S. Cl. .................... 257/712; 257/722; 257/723; 257/717; 257/726; 165/80.3; 165/104.33; 165/122; 341/697; 341/719; 341/709
(58) Field of Search .................... 257/722, 725, 257/712–717, 707, 726, 727; 361/697, 688.04; 165/80.3, 185; 174/16.3

(56) References Cited

U.S. PATENT DOCUMENTS

| 4,681,154 | * | 7/1987 | Yano et al. ........................ 165/47 |
|---|---|---|---|
| 4,964,458 | * | 10/1990 | Flint et al. ........................ 257/722 |
| 5,136,329 | * | 8/1992 | Sugiura ........................ 361/388 |
| 5,228,850 | * | 7/1993 | Hoetzl et al. ........................ 432/176 |
| 5,604,665 | * | 2/1997 | Chrysler et al. ........................ 257/722 |
| 5,629,560 | * | 5/1997 | Katsui et al. ........................ 257/721 |
| 5,630,469 | * | 5/1997 | Butterbaugh et al. ........................ 257/722 |
| 5,638,895 | * | 6/1997 | Dodson ........................ 165/121 |
| 5,726,495 | * | 3/1998 | Aihara et al. ........................ 257/722 |
| 5,729,433 | * | 3/1998 | Mok ........................ 257/727 |
| 5,729,995 | * | 3/1998 | Tajima ........................ 62/259.2 |
| 5,756,931 | * | 5/1998 | Kitahara et al. ........................ 361/709 |
| 5,763,950 | * | 6/1998 | Fujisaki et al. ........................ 257/712 |
| 5,768,103 | * | 6/1998 | Kohrinetz et al. ........................ 257/714 |
| 5,787,971 | * | 8/1998 | Dodson ........................ 165/121 |
| 5,793,608 | * | 8/1998 | Winick et al. ........................ 361/695 |
| 5,838,066 | * | 11/1998 | Kitao ........................ 257/721 |
| 5,927,386 | * | 7/1999 | Lin ........................ 165/80.3 |
| 5,953,209 | * | 9/1999 | Chiu ........................ 361/697 |
| 5,991,153 | * | 11/1999 | Heady et al. ........................ 361/704 |
| 6,021,844 | * | 2/2000 | Batchelder ........................ 165/80.3 |
| 6,023,413 | * | 2/2000 | Umezawa ........................ 361/697 |

FOREIGN PATENT DOCUMENTS 8316387A  11/1996  (JP) .

* cited by examiner

*Primary Examiner*—Alexander O. Williams
(74) *Attorney, Agent, or Firm*—Stevens, Davis, Miller & Mosher, L.L.P.

(57) ABSTRACT

It is intended to provide a heat sink unit and an electronic apparatus capable of efficiently cooling a plurality of semiconductor devices and taking action for unnecessary electromagnetic waves. There are provided a plurality of fan units and electromagnetic shielding means for cutting off electromagnetic waves on a heat sink substrate. It is also provided a heat sink substrate, a unit having a fan for supplying fluid to the heat sink substrate and driving means for rotating the fan, and electromagnetic shielding means provided for the heat sink substrate.

35 Claims, 5 Drawing Sheets

HEAT SINK UNIT FOR COOLING A PLURALITY OF EXOTHERMIC UNITS, AND ELECTRONIC APPARATUS COMPRISING THE SAME

BACKGROUND OF THE INVENTION

1. Field of the Invention

The present invention relates to a heat sink unit for cooling a semiconductor device such as an IC and to an electronic apparatus.

2. Description of the Prior Art

Conventionally, a heat sink unit is used to cool a semiconductor producing a high temperature. Particularly, a fan-motor integrated heat sink unit having a high cooling effect in which a small fan is built in a heat sink is recently used in order to correspond to a high temperature produced by an MPU.

A conventional heat sink unit is described below. FIG. 6 is a perspective view showing a conventional heat sink unit. In FIG. 6, numeral 1 denotes a substrate and a plurality of semiconductor devices 2, 3, 4, 5, and 6 are set on the substrate 1. Numeral 7 denotes a heat sink unit which is set on a semiconductor device 6 producing a relatively large amount of heat. The heat sink unit 7 comprises a plurality of fins 8, a fan 9, and a motor 10 for rotating the fan 9.

An air flow is generated by rotating the fan 9 by the motor 10 and the semiconductor device 6 is prevented from being abnormally heated by applying the air flow to the fins 8. That is, the heat produced by the semiconductor device 6 is transmitted to the fins 8 and cooled by the air flow. Moreover, the air flow coming out of the heat sink 7 contacts the semiconductor devices 2, 3, 4, and 5 to cool the semiconductor devices 2, 3, 4, and 5.

However, the above conventional heat sink unit 7 has a limit in its cooling capacity. In addition to the heat produced by the semiconductor device 6 serving as a CPU, the amount of heat produced by the semiconductor devices 2, 3, 4, and 5 is increased because operation speeds of the semiconductor devices 2, 3, 4, and 5 are increased (clock acceleration) and a computer having two CPUs appears. Therefore, a problem occurs that adequate cooling cannot be made only by the air flow discharged from the heat sink unit 7.

Moreover, because electromagnetic waves are inevitably generated due to clock acceleration, a problem occurs that an action must be taken for electromagnetic waves in order to cut off unnecessary electromagnetic waves emitted from a lead 6a of the semiconductor device 6.

SUMMARY OF THE INVENTION

It is an object of the present invention to provide a heat sink unit and an electronic apparatus capable of efficiently cooling a plurality of semiconductor devices and taking action for unnecessary electromagnetic waves.

To achieve the above object of the present invention, the present invention has a plurality of fan units and electromagnetic shielding means for cutting off electromagnetic waves on a heat sink substrate.

Moreover, a function capable of controlling unnecessary electromagnetic waves emitted from a semiconductor device and the like is obtained because of using a heat sink substrate, a fan unit having a fan for supplying fluid to the heat sink substrate and driving means for rotating the fan, and electromagnetic shielding means provided for the heat sink substrate.

Furthermore, a function capable of controlling unnecessary electromagnetic waves emitted from a semiconductor device and the like is obtained by providing electromagnetic shielding means for a heat sink substrate by at least one of ways of constituting the heat sink substrate with an electromagnetic shielding material, forming a film made of the electromagnetic shielding material on the heat sink substrate, and attaching a plate made of the electromagnetic shielding material to the heat sink substrate and moreover, has a function capable of improving the productivity because the electromagnetic shielding means can be easily set.

Furthermore, a function capable of efficiently transmitting the heat discharged from semiconductor devices with different heights to a heat sink substrate is obtained by setting a sheet having at least either of elasticity and plasticity to the heat sink substrate or forming a recess on the heat sink substrate.

Furthermore, in the case of an electronic apparatus of the present invention provided with a substrate, a plurality of exothermic elements set on the substrate, and a heat sink unit set on the exothermic elements, the heat sink unit is provided with a heat sink substrate, a fan for supplying fluid to the heat sink substrate, and driving means for rotating the fan. Therefore, a function capable of securely and efficiently cooling the exothermic elements is obtained by setting the exothermic elements to the heat sink substrate and cooling the exothermic elements by one heat sink substrate and moreover, a function capable of improving the productivity is obtained because the number of parts is decreased so that the structure is simplified.

Furthermore, a function capable of improving the cooling efficiency is obtained by setting a plurality of fan units on a heat sink substrate.

Furthermore, a function capable of controlling unnecessary electromagnetic waves emitted from a semiconductor device and the like is obtained by setting electromagnetic shielding means to a heat sink substrate.

Furthermore, a function capable of improving the productivity is obtained because electromagnetic shielding means can be easily set by providing the electromagnetic shielding means for a heat sink substrate by at least one of ways of constituting the heat sink substrate with an electromagnetic shielding material, forming a film made of the electromagnetic shielding material on the heat sink substrate, and attaching a plate made of the electromagnetic shielding material to the heat sink substrate.

Furthermore, a function capable of efficiently leading the heat produced by exothermic elements with different heights to a heat sink substrate is obtained because a plurality of exothermic elements are a plurality of semiconductor devices, at least one of the exothermic elements has a setting height from the substrate different from that of other elements, and moreover means to be brought into contact with the semiconductor devices is set to the heat sink substrate.

Furthermore, a function capable of improving the productivity is obtained because a heat sink substrate can be easily brought into contact with a plurality of semiconductor devices at a low cost by setting a sheet having at least either of elasticity and plasticity to the heat sink substrate as means to be brought into contact with the semiconductor devices or forming a recess on the heat sink substrate.

DESCRIPTION OF THE PREFERRED EMBODIMENTS

Embodiment 1

An embodiment of the present invention is described below.

Figure 1:
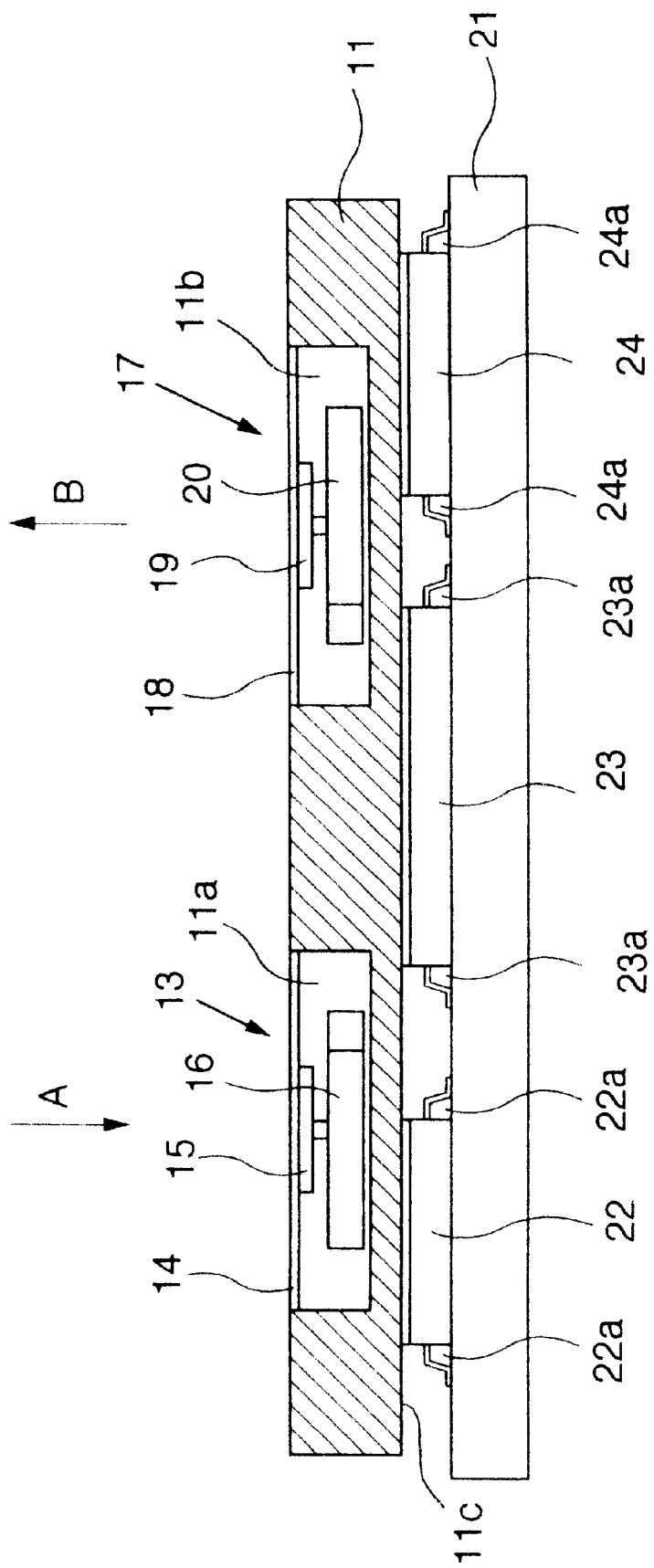
FIG. 1 is a side view showing the heat sink unit of an embodiment of the present invention.
Figure 2:
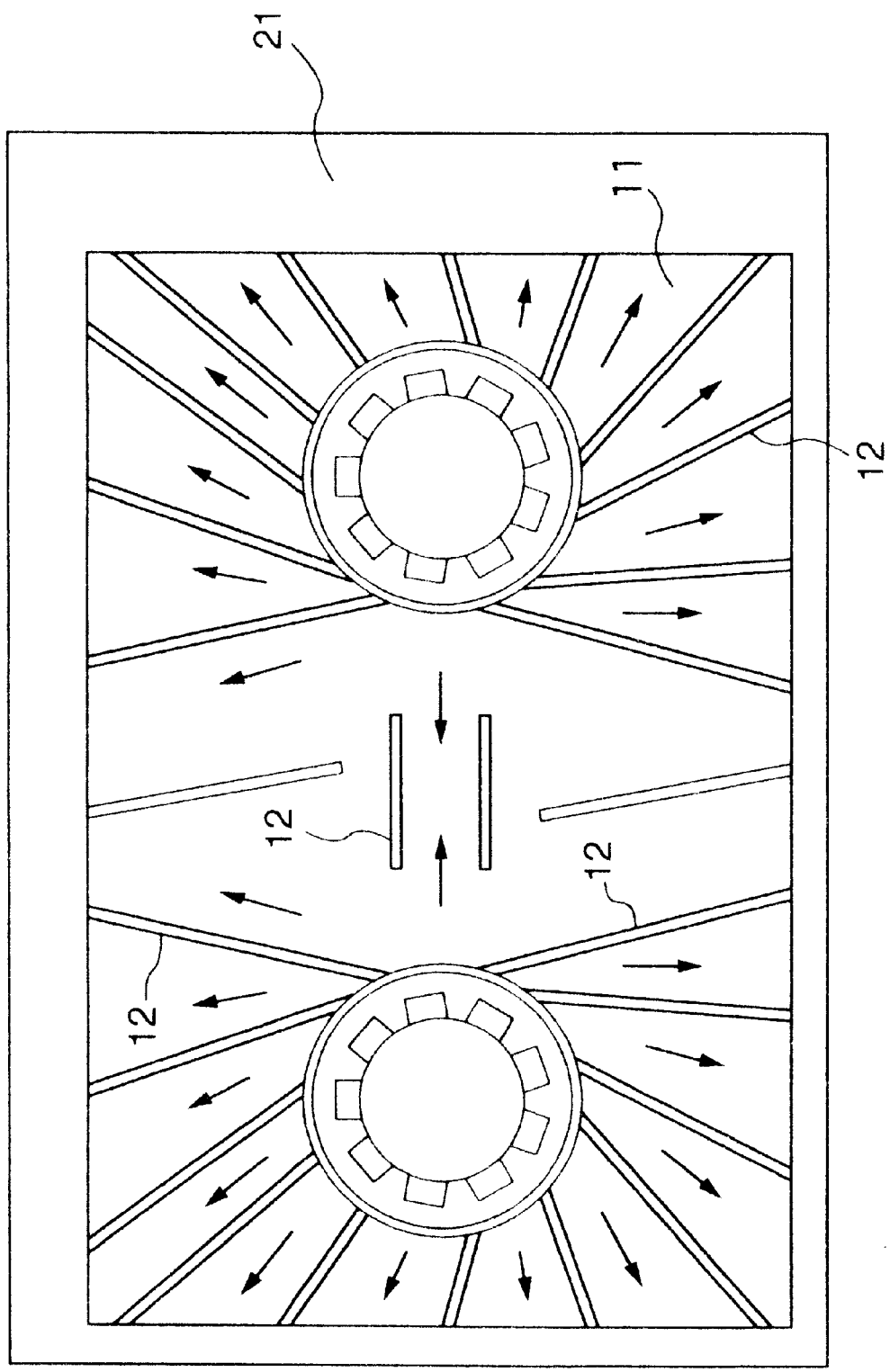
FIG. 2 is a top view showing the heat sink unit of an embodiment of the present invention.

FIGS. 1 and 2 are a side view and a top view of the heat sink unit of an embodiment of the present invention.

In FIGS. 1 and 2, numeral 11 denotes a heat sink substrate made of a material having a high heat conductivity such as aluminum or iron and a plurality of fins 12 are vertically set to the heat sink substrate 11. In the case of an embodiment of the present invention, the heat sink substrate 11 is made of aluminum and its alloy. However, it is possible to constitute the substrate 11 with a resin and ceramic having a high heat conductivity. When constituting the heat sink substrate 11 with a metal such as aluminum or the like, the mechanical strength is increased because aluminum has a very high heat conductivity and thereby, the cooling efficiency is greatly improved and moreover, the stiffness of the heat sink substrate 11 is increased. Moreover, when constituting the heat sink substrate 11 with a resin, the productivity is improved because the substrate 11 can be easily made. Moreover, when the heat sink substrate 11 is constituted by ceramic, it is possible to greatly improve the dimensional accuracy because the machining accuracy is very high. Further, in FIG. 2, each of arrows shows the direction of an air flow.

Furthermore, in the case of an embodiment of the present invention, the fins 12 vertically set to the heat sink substrate 11 are constituted by integrally forming plates. However, it is also possible to vertically set pin-like fins. Moreover, in the case of an embodiment of the present invention, the fins 12 are integrally formed with the heat sink substrate 11. However, it is also possible to separately form the fins 12 and bond them to the heat sink substrate 11 by an adhesive or the like or mechanically fit them into the substrate 11.

Numeral 13 denotes a fan unit. The fan unit 13 comprises a motor mount 14, a motor 15 set to the motor mount 14, and a fan 16 to be rotated by the motor 15. The motor mount 14 is secured to the fins 12 by using means such as an adhesive or screws. Power is supplied to the motor 15 from an external unit by not-illustrated lead wires.

Moreover, the heat sink substrate 11 is provided with another fan unit 17 in addition to the fan unit 13. The fan unit 17 comprises a motor mount 18, a motor 19, and a fan 20 similarly to the case of the fan unit 13 and the motor mount 18 is set to the heat sink substrate 11 by an adhesive or screws. These fan units 13 and 17 are stored in storing sections 11a and 11b provided for the heat sink substrate 11.

The motors 15 and 19 can respectively use driving means such as an AC motor or DC motor. Moreover, in the case of an embodiment of the present invention, it is possible to lengthen the service life of a bearing and the like because heat can be prevented from being directly added to the bearings of the motors 15 and 19 by setting the motors 15 and 19 to the heat sink substrate 11 through the motor mounts 14 and 18. Furthermore, to downsize a heat sink unit, it is possible to set the motors 15 and 19 directly onto the heat sink substrate 11 by omitting the motor mounts 14 and 18. In this case, the motors 15 and 19 are set between the heat sink substrate 11 on one hand and the fans 16 and 20 on the other respectively.

Furthermore, in the case of an embodiment of the present invention, the fan unit 13 is set in order of the fan 16, motor 15, and motor mount 14 from the heat sink substrate 11 side and the fan unit 17 is similarly set in order of the fan 20, motor 19, and motor mount 18 from the heat sink substrate 11 side. However, it is also possible to set the fan unit 13 in order of the motor mount 14, motor 15, and fan 16 from the heat sink substrate 11 side and similarly set the fan unit 17 in order of the motor mount 18, motor 19, and fan 20 from the heat sink substrate 11 side.

Furthermore, it is possible to use cross-flow fan units instead of the fan units 13 and 17.

Numeral 21 denotes a substrate. Semiconductor devices 22, 23, and 24 are set to the substrate 21. The semiconductor devices 22, 23, and 24 are brought into contact with a plane 11c opposite to the plane to which the fan units 13 and 17 of the heat sink substrate 11 are set. It is enough that the semiconductor devices 22, 23, and 24 are merely brought into contact with the heat sink substrate 11. To further improve the heat radiation effect, however, it is preferable to connect the heat sink substrate 11 with the semiconductor devices 22, 23, and 24 by an adhesive or the like and it is more preferable to use an adhesive superior in heat conductivity (e.g. adhesive obtained by dispersing metallic particles in a polymeric material).

In the case of a heat sink unit constituted as described above, when the power supply of an electronic apparatus is turned on, the fan units 13 and 17 rotate to supply air to the heat sink substrate 11 and discharge the heat produced by the semiconductor devices 22, 23, and 24 together with the air through the heat sink substrate 11. Therefore, the semiconductor devices 22, 23, and 24 are completely cooled and therefore, no thermal damage is added to the devices 22, 23, and 24.

In the case of an embodiment of the present invention, when the power supply of an electronic apparatus is turned on, the same power is supplied to the fan units 13 and 17 to make the units 13 and 17 generate the same air flow. However, because the semiconductor devices 22, 23, and 24 do not greatly produce heat immediately after the power supply is turned on, it is possible to reduce the power consumption by driving only the fan unit 13 and stopping the fan unit 17 or keeping the numbers of revolutions of the fan units at a low level.

Moreover, though not illustrated, it is possible to securely cool the semiconductor devices 22, 23, and 24 by setting temperature detection means such as a temperature sensor onto or nearby the heat sink substrate 11 and controlling the numbers of revolutions of the fan units 13 and 17 in accordance with the information supplied from the temperature detection means. Furthermore, when the semiconductor devices 22, 23, and 24 do not greatly produce heat, it is possible to reduce the power consumption by decreasing the power to be supplied to the fan units 13 and 17.

Furthermore, though not illustrated, it is possible to securely cool the semiconductor devices 22, 23, and 24 and reduce the power consumption as described above by setting a plurality of temperature detection means onto or nearby the heat sink substrate 11, measuring the difference of produced amount of heat between the semiconductor devices 22, 23, and 24 and the imbalance of the temperature distribution of the heat sink substrate 11, and controlling the numbers of revolutions of the fan units 13 and 17 in accordance with the temperature information on the devices 22, 23, and 24 and the substrate 11.

Furthermore, in the case of an embodiment of the present invention, though the air supply directions of the fan units 13 and 17 are the same direction, it is possible to improve the cooling efficiency by making the air supply direction of the fan unit 13 different from that of the fan unit 17. That is, as shown in FIG. 1, it is possible to efficiently convect the air on the heat sink substrate 11 by rotating the fan unit 13 so that an air flow occurs in the direction of arrow A and rotating the fan unit 17 so that an air flow occurs in the direction of arrow B. Therefore, it is possible to greatly improve the efficiency for cooling the heat sink substrate 11.

By using the above structure, the heat produced by the semiconductor devices 22, 23, and 24 is led to the heat sink substrate 11 and the temperature of the heat sink substrate 11 is raised but the heat sink substrate 11 is cooled by the air flows produced by the fan units 13 and 17. Therefore, it is possible to prevent the semiconductor devices 22, 23, and 24 from abnormally producing heat and improve the reliability of the apparatus.

Because an embodiment of the present invention makes it possible to cool the semiconductor devices 22, 23, and 24 at the same time, it is unnecessary to set a fan unit to each semiconductor device like the case of the prior art and therefore, the cost is greatly decreased.

Moreover, because an embodiment of the present invention makes it possible to increase an air flow rate by using two fan units, it is possible to sufficiently cool a plurality of semiconductor devices at the same time.

Though an embodiment of the present invention uses three semiconductor devices, it is also possible to use two or more than three semiconductor devices. When using a lot of semiconductor devices to be cooled are used, it is preferable to use three fan units or more. In general, it is very advantageous from the aspect of cost to use the number of fan units less than the number of semiconductor devices. For example, when five semiconductor devices or more are used, it is preferable to use substantially three fan units.

Figure 3:
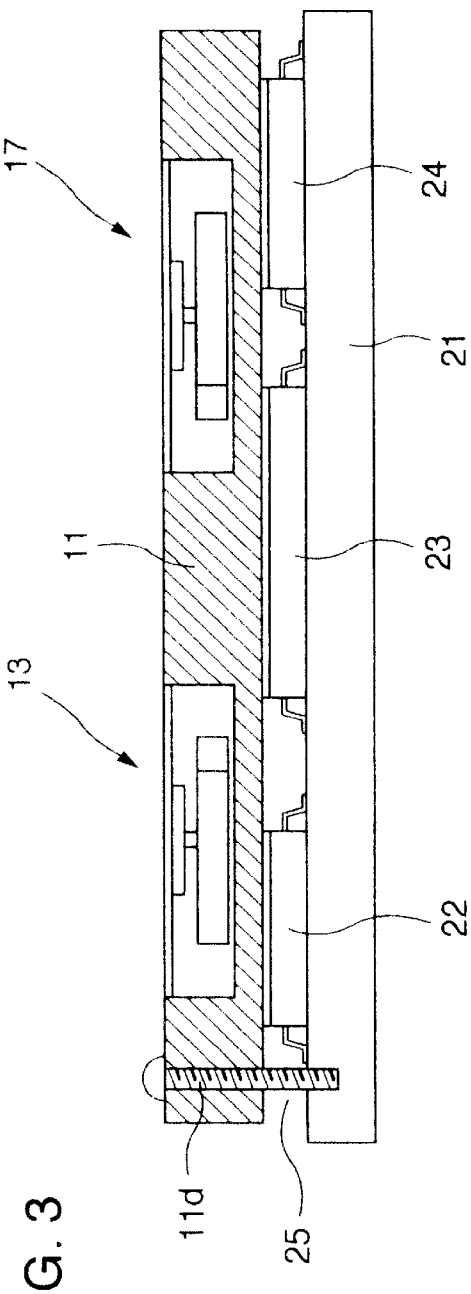
FIG. 3 is a side view showing the heat sink unit of an embodiment of the present invention.

Moreover, as shown in FIG. 3, it is possible to firmly secure the substrate 21 and heat sink substrate 11 by forming a through-hole lid on the heat sink substrate 11 and inserting a screw 25 into the through-hole lid. According to the above structure, the substrates 21 and 11 can be firmly secured without using any adhesive and moreover, easily removed. Therefore, it is possible to easily set the heat sink substrate 11 to other substrate and improve the availability. Though only the screw 25 is shown in FIG. 3, it is actually preferable to secure the substrates 21 and 11 with a plurality of screws.

Figure 4:
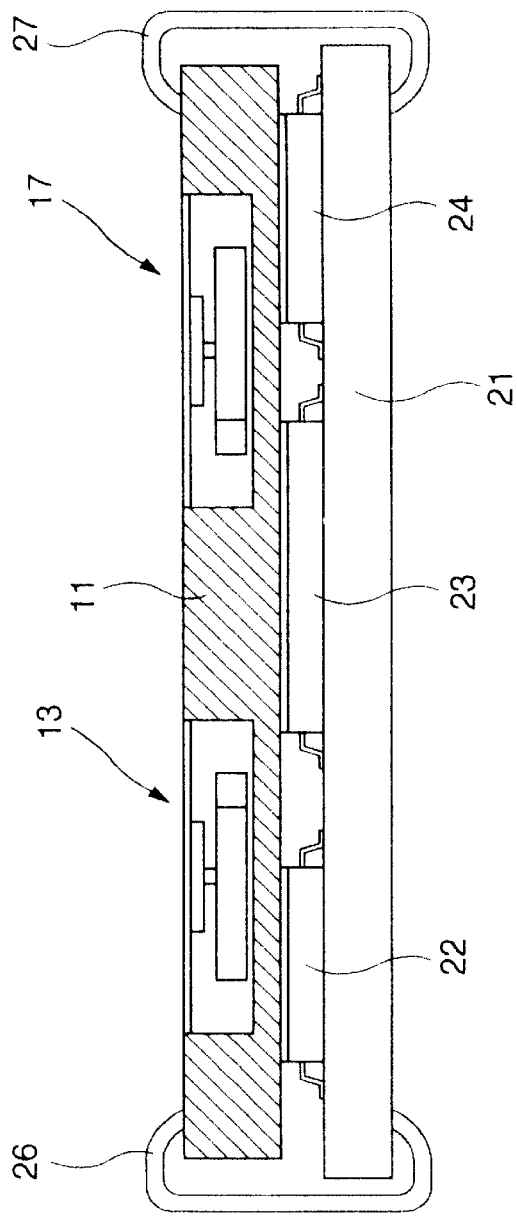
FIG. 4 is a side view showing the heat sink unit of an embodiment of the present invention.

Furthermore, as shown in FIG. 4, it is possible to bring the heat sink substrate 11 into contact with the semiconductor devices 22, 23, and 24 by holding the heat sink substrate 11 and substrate 21 with elastic clips 26 and 27 having a U-shaped cross section. According to the above structure, it is possible to bring the heat sink substrate 11 into contact with the semiconductor devices 22, 23, and 24 without using any adhesive or screw and therefore, the availability is improved because the heat sink substrate 11 can be very easily removed. Moreover, though an embodiment of the present invention uses simple elastic clips 26 and 27, it is possible to use other type of hardware as long as the hardware is elastic and makes it possible to bring the heat sink substrate 11 into contact with the semiconductor devices 22, 23, and 24.

Figure 5:
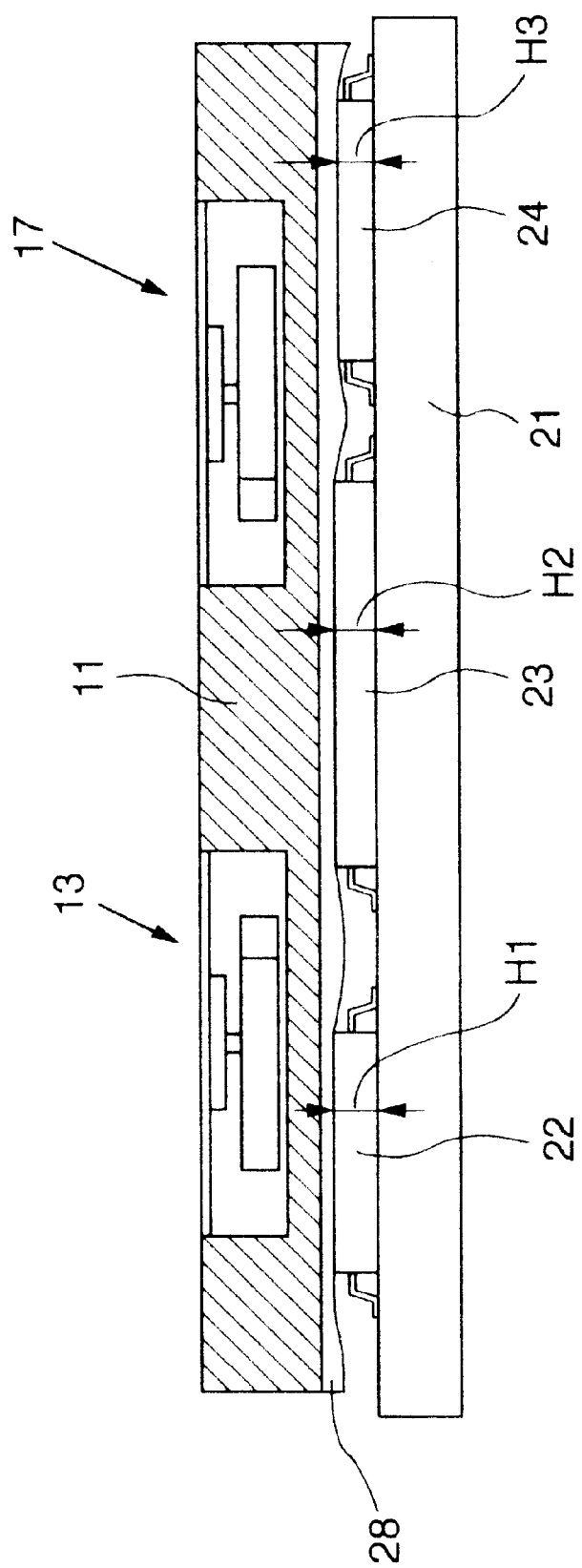
FIG. 5 is a side view showing the heat sink unit of an embodiment of the present invention.
Figure 6:
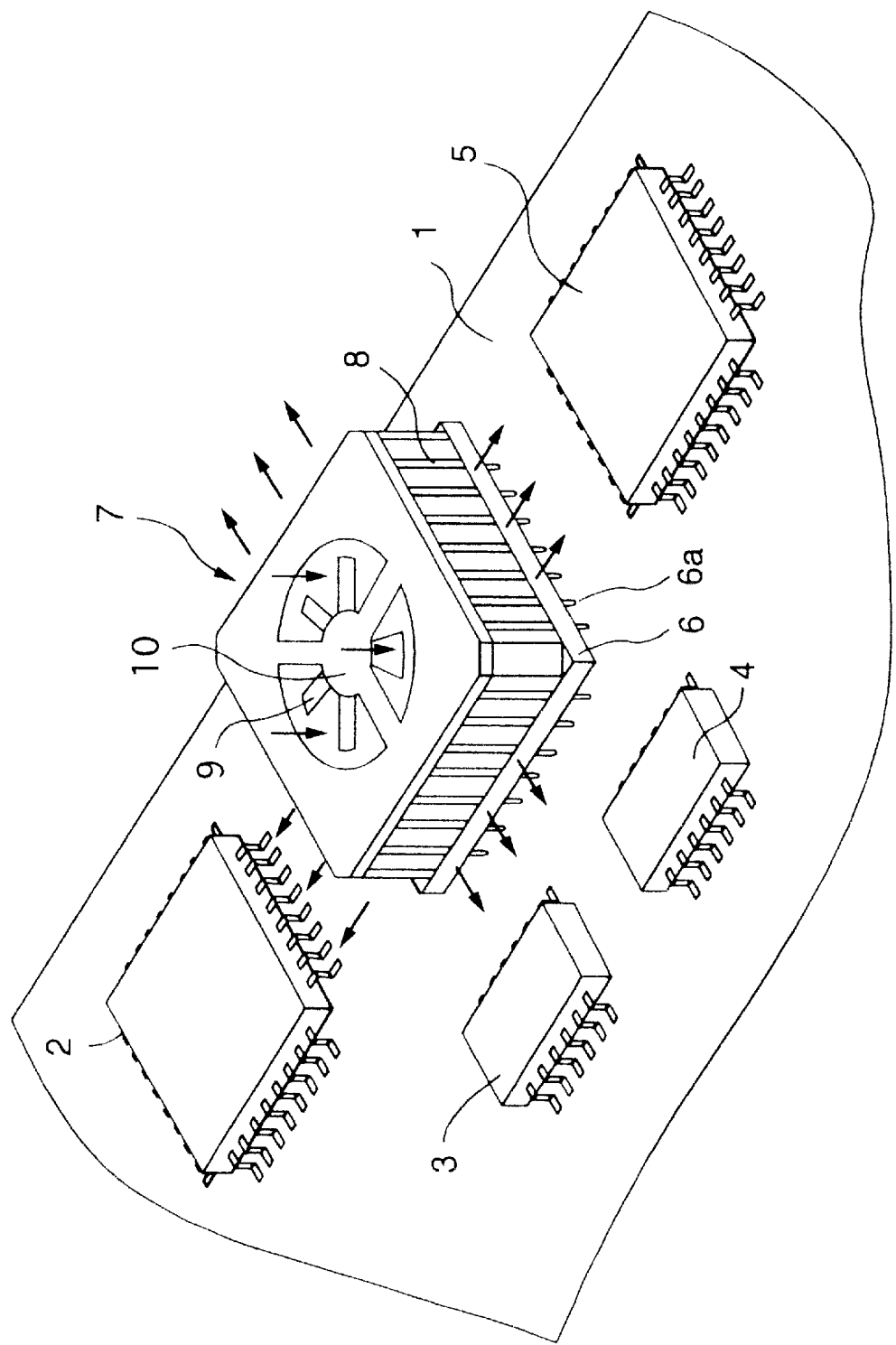
FIG. 6 is a perspective view showing a conventional heat sink unit.

Furthermore, because the semiconductor devices 22, 23, and 24 may have different heights H1, H2, and H3 in general, a semiconductor device not being contact with the heat sink substrate 11 may be present and the semiconductor device may not be preferably cooled if the planes of the heat sink substrate 11 to be brought into contact with the semiconductor devices 22, 23, and 24 are flat. In this case, as shown in FIG. 5, it is preferable to set a sheet 28 having at least either of elasticity and plasticity to the planes of the heat sink substrate 11 to be brought into contact with the semiconductor devices 22, 23, and 24. According to the above structure, it is possible that the semiconductor devices 22, 23, and 24 is in good contact with the heat sink substrate 11 through the sheet 28 even if the semiconductor devices 22, 23, and 24 have different heights. Therefore, the semiconductor devices 22, 23, and 24 are efficiently cooled. Moreover, the sheet 28 can use a resin such as polyester or plastic or an alloy as a specific material.

Furthermore, instead of using the sheet 28 as described above, by forming recesses corresponding to the heights of the semiconductor devices 22, 23, and 24 on the planes of the heat sink substrate 11 to be brought into contact with the devices 22, 23, and 24 and storing the devices 22, 23, and 24 in their corresponding recess respectively, it is possible to securely bring the heat sink substrate 11 into contact with the devices 22, 23, and 24. Specifically, when the heights of the semiconductor devices 22, 23, and 24 meet an inequality H1>H2>H3, recesses are formed on the portions of the heat sink substrate 11 facing the semiconductor devices 22, 23, and 24 respectively. Then, in this case, because the height H1 is the largest, the depth of the recess formed on the portion facing the semiconductor device 22 is made the largest and the recess facing the semiconductor device 24 is made the smallest. According to the above structure, it is possible to securely bring the heat sink substrate 11 into contact with the semiconductor devices 22, 23, and 24 and moreover, easily position the heat sink substrate 11.

Furthermore, by accelerating the clock of the semiconductor devices 22, 23, and 24, unnecessary electromagnetic waves may be generated by leads 22a, 23a, and 24a of the semiconductor devices 22, 23, and 24. Therefore, to prevent the electromagnetic waves, it is preferable to constitute the heat sink substrate 11 by an electromagnetic shielding material. The electromagnetic shielding material uses, for example, a magnetic material such as ferrite or permalloy, conductive elastomer, or metallic mesh. Thus, by constituting the heat sink substrate 11 by an electromagnetic shielding material so as to cover the semiconductor devices 22, 23, and 24, it is possible to cut off the unnecessary electromagnetic waves generated by the leads 22a, 23a, and 24a. Furthermore, it is possible to form an electromagnetic shielding material on the surface of the heat sink substrate 11 by means of vacuum evaporation, sputtering, thermal spraying, or coating. In this case, because the main material of the heat sink substrate 11 can be determined by considering the workability and cost, it is possible to improve the productivity. Moreover, because an electromagnetic shielding material to be formed on the heat sink substrate 11 can be easily changed in accordance with the purpose or using environment, it is possible to select the type of a semiconductor device to be cooled and a material corresponding to unnecessary electromagnetic waves. Furthermore, it is possible to form an electromagnetic shielding material like a sheet (metallic tape, metallic mesh, conductive elastomer, etc.) and attach it to the planes of the heat sink substrate 11 facing the semiconductor devices 22, 23, and 24. It is particularly preferable to form a structure so as to cool a plurality of semiconductor devices and simultaneously cover the lead portions of the semiconductor devices like an embodiment of the present invention.

Though the semiconductor devices 22, 23, and 24 described in the embodiment of the present invention use an LSI, memory, or IC, it is also possible to use other exothermic element (such as laser diode or transistor). Moreover, in the case of the embodiment of the present invention, the semiconductor devices 22, 23, and 24 are directly set to the heat sink substrate 11 or they are bonded to the substrate 11 through an adhesive. However, it is also possible to indirectly set the devices 22, 23, and 24 to the substrate 11 through a member having a high heat conductivity.

What is claimed is:

1. A heat sink unit for cooling a plurality of exothermic elements, said unit comprising:
   a single heat sink substrate comprising a plurality of fans, and
   means for mounting said plurality of exothermic elements to said heat sink substrate.

2. A heat sink unit according to claim 1, further comprising electromagnetic shielding means independent from said heat sink substrate.

3. A heat sink unit according to claim 1, further comprising means for placing in close contact with said heat sink substrate a plurality of exothermic elements having different heights.

4. A heat sink unit according to claim 3, wherein said means for placing in close contact is a plastic or elastic sheet having sufficient flexibility which is attached to a lower surface of, or is attached to a recess in a lower surface of, said heat sink substrate.

5. A heat sink unit according to claim 1, further comprising:
   i) electromagnetic shielding means independent from said heat sink substrate, and
   ii) means for placing in close contact with said heat sink substrate a plurality of exothermic elements having different heights.

6. A heat sink unit according to claim 5, wherein said means for placing in close contact is a plastic or elastic sheet having sufficient flexibility which is attached to a lower surface of, or is attached to a recess in a lower surface of, said heat sink substrate.

7. A heat sink unit for cooling a plurality of exothermic elements, said unit comprising:
   a single heat sink substrate comprising a single fan, and
   means for mounting said plurality of exothermic elements to said heat sink substrate.

8. A heat sink unit according to claim 7, further comprising electromagnetic shielding means independent from said heat sink substrate.

9. A heat sink unit according to claim 7, further comprising means for placing in close contact with said heat sink substrate a plurality of exothermic elements having different heights.

10. A heat sink unit according to claim 9, wherein said means for placing in close contact is a plastic or elastic sheet having sufficient flexibility which is attached to a lower surface of, or is attached to a recess in a lower surface of, said heat sink substrate.

11. A heat sink unit according to claim 7, further comprising:
    i) electromagnetic shielding means independent from said heat sink substrate, and
    ii) means for placing in close contact with said heat sink substrate a plurality of exothermic elements having different heights.

12. A heat sink unit according to claim 11, wherein said means for placing in close contact is a plastic or elastic sheet having sufficient flexibility which is attached to a lower surface of, or is attached to a recess in a lower surface of, said heat sink substrate.

13. An electronic apparatus comprising:
    a circuit board,
    a plurality of exothermic elements mounted on said circuit board,
    a heat sink unit comprising a single heat sink substrate comprising a plurality of fans, and
    means for mounting said plurality of exothermic elements to said heat sink substrate.

14. An electronic apparatus according to claim 13, further comprising electromagnetic shielding means independent from said heat sink substrate.

15. An electronic apparatus according to claim 13, further comprising means for placing in close contact with said heat sink substrate a plurality of exothermic elements having different heights.

16. An electronic apparatus according to claim 15, wherein said means for placing in close contact is a plastic or elastic sheet having sufficient flexibility which is attached to a lower surface of, or is attached to a recess in a lower surface of, said heat sink substrate.

17. An electronic apparatus according to claim 13, further comprising:
    i) electromagnetic shielding means independent from said heat sink substrate, and
    ii) means for placing in close contact with said heat sink substrate a plurality of exothermic elements having different heights.

18. An electronic apparatus according to claim 17, wherein said means for placing in close contact is a plastic or elastic sheet having sufficient flexibility which is attached to a lower surface of, or is attached to a recess in a lower surface of, said heat sink substrate.

19. An electronic apparatus comprising:
    a circuit board,
    a plurality of exothermic elements mounted on said circuit board,
    a heat sink unit comprising a single heat sink substrate comprising a single fan, and
    means for mounting said plurality of exothermic elements to said heat sink substrate.

20. An electronic apparatus according to claim 19, further comprising electromagnetic shielding means independent from said heat sink substrate.

21. An electronic apparatus according to claim 19, further comprising means for placing in close contact with said heat sink substrate a plurality of exothermic elements having different heights.

22. An electronic apparatus according to claim 21, wherein said means for placing in close contact is a plastic or elastic sheet having sufficient flexibility which is attached to a lower surface of, or is attached to a recess in a lower surface of, said heat sink substrate.

23. An electronic apparatus according to claim 19, further comprising:
    i) electromagnetic shielding means independent from said heat sink substrate, and
    ii) means for placing in close contact with said heat sink substrate a plurality of exothermic elements having different heights.

24. An electronic apparatus according to claim 23, wherein said means for placing in close contact is a plastic or elastic sheet having sufficient flexibility which is attached to a lower surface of, or is attached to a recess in a lower surface of, said heat sink substrate.

25. An electronic apparatus comprising:

a circuit board, a plurality of exothermic elements mounted on said circuit board, and a heat sink unit comprising a single heat sink substrate comprising a plurality of fans and means for mounting said plurality of exothermic elements to said heat sink substrate, and wherein said circuit board, said plurality of exothermic elements, and said heat sink unit are independent from one another so as to form a laminated structure.

26. A heat sink unit comprising:

a heat sink substrate comprising a first surface and a second surface, the first surface having a plurality of fins disposed thereon, and the second surface having a flat portion;

a fan disposed between the plurality of fins; and a plurality of exothermic elements mounted on the flat portion.

27. A heat sink unit comprising:

a heat sink substrate comprising a first surface and a second surface, the first surface having a plurality of fins disposed thereon, and the second surface having a flat portion;

a plurality of fans disposed between the plurality of fins; and a plurality of exothermic elements mounted on the flat portion.

28. A heat sink unit comprising:

a heat sink substrate comprising a first surface and a second surface, the first surface having a plurality of fins disposed thereon so as to extend to an end of the substrate, and the second surface having a flat portion;

a plurality of fans disposed between the plurality of fins, wherein at least one fan rotates in a direction perpendicular to the first surface; and a plurality of exothermic elements mounted on the flat portion.

29. A heat sink unit comprising:

a heat sink substrate comprising a first surface and a second surface, the first surface having a plurality of fins disposed thereon, and the second surface having a plurality of flat portions, the flat portions having different heights arranged in a stepwise pattern;

a fan disposed between the plurality of fins; and a plurality of exothermic elements mounted on the flat portions.

30. A heat sink unit comprising:

a heat sink substrate comprising a first surface and a second surface, the first surface having a plurality of fins disposed thereon, and the second surface having a plurality of flat portions, the flat portions having different heights arranged in a stepwise pattern;

a plurality of fans disposed between the plurality of fins; and a plurality of exothermic elements mounted on the flat portions.

31. A heat sink unit according to claim 30, wherein the heat sink substrate is coated with an electromagnetic shielding material.

32. A heat sink unit according to claim 30, wherein a sheet-shaped electromagnetic shielding material is attached to the second surface.

33. A heat sink unit according to claim 26, wherein the fins extend to an end of the substrate.

34. A heat sink unit according to claim 27, wherein a sheet-shaped electromagnetic shielding material is attached to the second surface.

35. An electronic apparatus comprising a circuit board, a plurality of exothermic elements having a first surface and a second surface, the first surface being mounted on the circuit board, and a heat sink unit, wherein the heat sink unit comprises:

a heat sink substrate comprising a first surface and a second surface, the first surface having a plurality of fins disposed thereon, and the second surface having a flat portion, and a fan disposed between the plurality of fins, wherein the second surface of the exothermic elements is attached to the flat portion.

* * * * *